(12) United States Patent
Chen et al.

(10) Patent No.: US 9,093,131 B2
(45) Date of Patent: Jul. 28, 2015

(54) SENSE AMPLIFIER CIRCUIT CAPABLE OF DETERMINING AMPLIFICATION FACTOR OF CELL CURRENT BASED ON OPERATION CYCLES

(71) Applicant: UNITED MICROELECTRONICS CORP., Hsin-Chu (TW)

(72) Inventors: Hsi-Wen Chen, Kaohsiung (TW); Hsin-Pang Lu, Hsinchu County (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 29 days.

(21) Appl. No.: 14/108,360

(22) Filed: Dec. 17, 2013

(65) Prior Publication Data

US 2015/0170718 A1 Jun. 18, 2015

(51) Int. Cl.
*G11C 16/06* (2006.01)
*G11C 7/06* (2006.01)
*G11C 7/12* (2006.01)
*G11C 7/22* (2006.01)

(52) U.S. Cl.
CPC .... *G11C 7/062* (2013.01); *G11C 7/12* (2013.01); *G11C 7/22* (2013.01)

(58) Field of Classification Search
USPC .............. 365/185.21, 185.29, 189.07, 207
See application file for complete search history.

(56) References Cited

U.S. PATENT DOCUMENTS 6,483,352 B1 11/2002 Kuo
6,856,528 B1 * 2/2005 Kim .......................... 365/49.1

* cited by examiner

*Primary Examiner* — Hoai V Ho
(74) *Attorney, Agent, or Firm* — Winston Hsu; Scott Margo (57) ABSTRACT

A sense amplifier circuit may be used for read operation of a non-volatile memory. The sense amplifier circuit includes of a first pre-charge circuit, a second pre-charge circuit, a bias circuit, an enable circuit, a current mirror, a first comparator, a second comparator, a buffer and a counter. The current mirror is able to amplify a cell current of a memory cell to prevent error and shorten or maintain access time as erase count of the memory cell increases.

15 Claims, 7 Drawing Sheets

SENSE AMPLIFIER CIRCUIT CAPABLE OF DETERMINING AMPLIFICATION FACTOR OF CELL CURRENT BASED ON OPERATION CYCLES

BACKGROUND OF THE INVENTION

1. Field of the Invention

The present invention discloses a sense amplifier circuit, and more particularly a sense amplifier circuit and a method of operation of a sense amplifier to be used for sensing low power signals for integrated circuits.

2. Description of the Prior Art

Non-volatile memory includes a plurality of memory cells. The non-volatile memory may have a sense amplifier as one of the elements in the non-volatile memory. The sense amplifier is an analogue circuit that is a part of the read circuitry which is used for reading data in the non-volatile memory. The sense amplifier may be used to sense the low power signals from a bit line which represents a data bit (1 or 0) stored in a memory cell, and amplify the small voltage swing to recognizable logic levels so the data can be interpreted properly by logic outside the memory.

The data bit (1 or 0) of a memory cell is differentiated by comparing cell current of a memory cell to a reference current. For logic 1 data bit, value of the cell current is greater than the value of the reference current. For logic 0 data bit, value of the cell current is lower than the reference current. Typically, the cell current for logic 0 data bit is set at zero amperes.

An increased number of programming cycles affects the value of the cell current of the memory cell. AS the number of programming cycles increase, the value of the cell current changes to value that is closer to the reference current. When the value of the cell current and the reference current is close enough, the sense amplifier would not be able to accurately compare the cell current and the reference current, thus, error occurs.

SUMMARY OF THE INVENTION

An embodiment of a sense amplifier circuit is disclosed. The sense amplifier circuit comprises a reference circuit configured to generate a reference voltage according to a reference current, a first pre-charge circuit configured to generate a charge voltage greater than the reference voltage, a second pre-charge circuit configured to generate a cell current, a current mirror coupled to the first pre-charge circuit and configured to amplify the cell current to generate an amplified cell current, an enable circuit coupled to the second pre-charge circuit and configured to enable the current mirror, a first comparator coupled to the current mirror and configured to compare the reference voltage and a new charge voltage generated according to the amplified cell current and the charge voltage to generate a comparison result, and a buffer configured to generate a sense amplifier output according to the comparison result.

An embodiment of a method of operation of a sense amplifier circuit is disclosed. The method of operation of the sense amplifier comprises generating a reference voltage according to a reference current, generating a charge voltage greater than the reference voltage, generating a cell current when the enable circuit is enabled, amplifying the cell current to generate an amplified cell current, generating a new charge voltage according the amplified cell current and the charge voltage, comparing the reference voltage and the new charge voltage to generate a comparison result, which is the data bit outputted by the sense amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
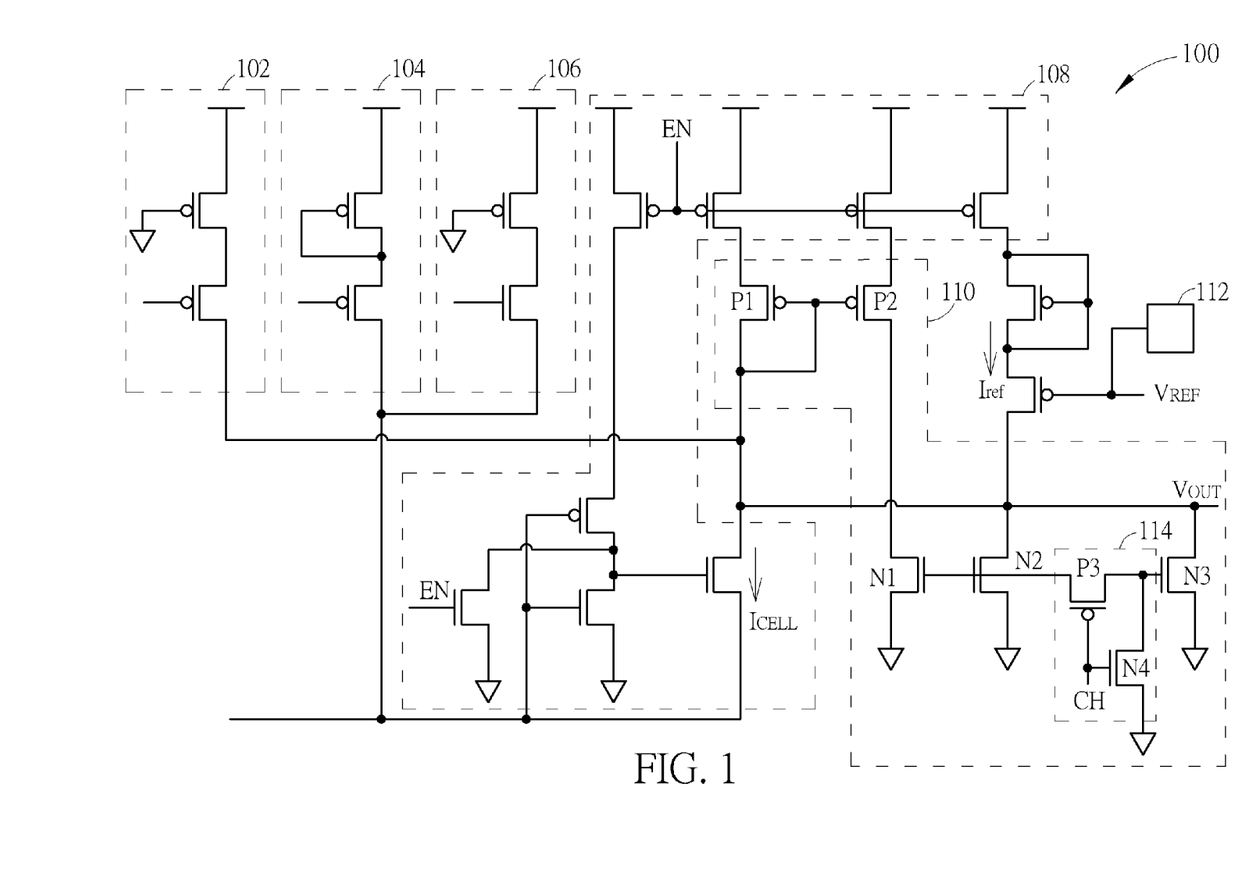
FIG. 1 illustrates a schematic diagram of a front end of a sense amplifier circuit according to the present invention.

Please refer to FIG. 1. FIG. 1 illustrates a schematic diagram of a front end 100 of a sense amplifier circuit according to the present invention. The front end 100 of the sense amplifier circuit comprises a first pre-charge circuit 102, a second pre-charge circuit 104, a bias circuit 106, an enable circuit 108, a current mirror 110, and a reference circuit 112. The reference circuit 112 is configured to generate a reference current $I_{REF}$ and a reference voltage $V_{REF}$ according to the reference current $I_{REF}$. The first pre-charge circuit 102 is configured to generate a charge voltage $V_{OUT}$ greater than the reference voltage $V_{REF}$. The second pre-charge circuit 104 is configured to pull a current of another circuit which may be a cell current $I_{CELL}$ of a memory cell of a non-volatile memory cell. The bias circuit 106 is coupled to the second pre-charge circuit 104 and is configured to generate a bias voltage for the second pre-charge circuit 104. The bias voltage from the bias circuit 106 is used to operate the second pre-charge circuit 104. The enable circuit 108 is configured to enable the current mirror 110 upon receiving an enable signal EN. The current mirror 110 is configured to amplify the cell current $I_{CELL}$ pulled from the memory cell. The current mirror 110 shall amplify the cell current $I_{CELL}$ by a factor corresponding to the erase count of the memory cell.

The current mirror 110 comprises of a first PMOS transistor P1, a second PMOS transistor P2, a first NMOS transistor N1, a second NMOS transistor N2, a third NMOS transistor N3 and a switch 114. The first PMOS transistor P1 has a first terminal, a second terminal and a gate terminal coupled to the enable circuit 108. The second terminal and the gate terminal of the first PMOS transistor P1 are coupled to each other. The second PMOS transistor P2 has a first terminal coupled to the enable circuit 108, a second terminal, and a gate terminal coupled to the gate terminal of the first PMOS transistor P1. The first NMOS transistor N1 has a first terminal coupled to the second terminal of the second PMOS transistor P2, a second terminal coupled to the common mode voltage, and a gate terminal coupled to the second terminal of the second PMOS transistor P2. The second NMOS transistor N2 has a first terminal, a second terminal coupled to the common mode voltage, and a gate terminal coupled to the gate terminal of the first NMOS transistor N1. The third NMOS transistor N3 has a first terminal coupled to the first terminal of the second NMOS transistor N2, a second terminal coupled to the common mode voltage, and a gate terminal.

The switch 114 has a first terminal coupled to the gate of the second NMOS transistor N2, a second terminal coupled to the common mode voltage, and a control terminal ctrl for receiving a control signal. The switch 114 comprises a third PMOS transistor P3, and a fourth NMOS transistor N4. The third PMOS transistor P3 has a first terminal coupled to the gate terminal of the second NMOS transistor N2, a second terminal coupled to the gate terminal of the third NMOS transistor N3, and a gate terminal coupled to the control terminal ctrl of the switch 114. The fourth NMOS transistor has a first terminal coupled to the second terminal of the third PMOS transistor P3, a second terminal coupled to the common mode voltage and a gate terminal coupled to the gate terminal of the third PMOS transistor P3.

The second NMOS transistor N2 has a width that is N times that of a width of the first NMOS transistor N1. And the third NMOS transistor N3 has a width that is M times that of the width of the width of the first NMOS transistor N1. N and M are the factors determining the amplification of the cell current $I_{CELL}$. For a predetermined number of erase count, the cell current $I_{CELL}$ is going to be multiplied N times. If the erase count is greater than the predetermined number, the cell current $I_{CELL}$ is multiplied by a factor equivalent to the sum of N and M. All the terminals of the second NMOS transistor N2 and the third NMOS transistor N3 are coupled respectively to each other. Having transistors coupled in parallel means having the first terminal of the second NMOS transistor N2 coupled to the first terminal of the third NMOS transistor N3 and so on. When one MOSFET device is coupled in parallel with another MOSFET device having the same length, the MOSFET devices will operate as one having the same length and a width that is equivalent to the total of the width of the two MOSFET devices.

The first pre-charge circuit 102, the second pre-charge circuit 104, the bias circuit 106 and the enable circuit 108 are coupled to a power supply voltage. And the enable circuit 108 and the current mirror 110 are coupled to a common mode voltage.

Figure 2:
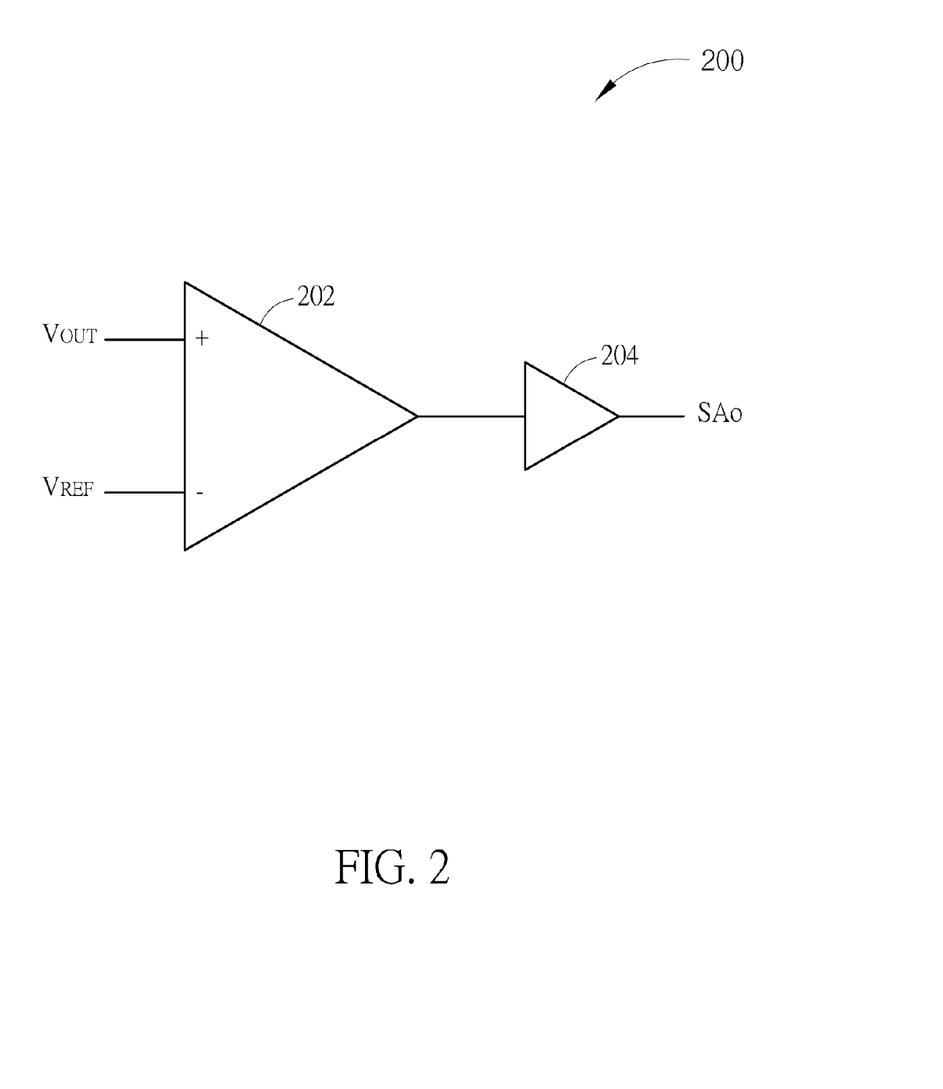
FIG. 2 illustrates a block diagram of a back end of the sense amplifier circuit according to the present invention.

Please refer to FIG. 2. FIG. 2 illustrates a block diagram of a back end 200 of the sense amplifier circuit according to the present invention. The back end 200 of the sense amplifier circuit comprises a first comparator 202 and a buffer 204. The first comparator 202 is coupled to the front end 100 of the sense amplifier circuit and is configured to compare the reference voltage $V_{REF}$ with the charge voltage $V_{OUT}$ to generate a comparison result. The buffer 204 is coupled to the first comparator 202 having the comparison result of the first comparator as an input of the buffer 204, and conditions the comparison result so as to generate a sense amplifier output $SA_O$.

Figure 3:
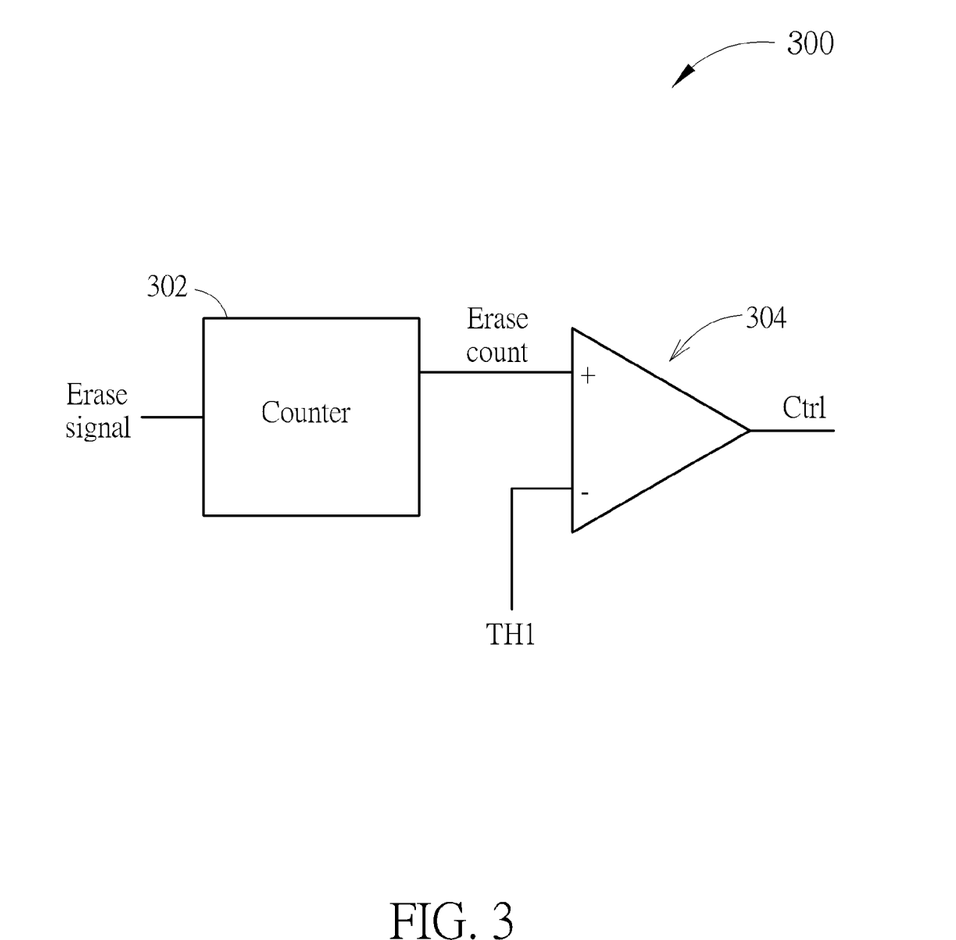
FIG. 3 illustrates a block diagram of a control circuit according to the present invention.

Please refer to FIG. 3. FIG. 3 illustrates a block diagram of a control circuit 300 according to the present invention. The control circuit 300 comprises of a counter 302 and a second comparator 304. The counter 302 has a first input terminal and an output terminal that is configured to generate the erase count of the memory cell. The first input terminal of the counter 302 takes the erase signal to trigger the counter 302. The counter 302 will add one to the erase count for each erase signal received. The erase count is compared to a threshold TH1 by the second comparator 304 and generates a control signal ctrl.

When the sense amplifier circuit is turned on, the reference circuit 112 shall generate the reference voltage $V_{REF}$. The reference circuit 112 is a circuit that can produce a fixed voltage and/or a fixed current irrespective of power supply variations, temperature changes and the loading of a device. The reference circuit 112 may be a bandgap reference circuit. The reference voltage $V_{REF}$ remains constant as long as the sense amplifier circuit is turned on.

The first pre-charge circuit 102 is first enabled and generates the charge voltage $V_{OUT}$ that is greater than the reference voltage $V_{REF}$ and is the initial condition of the sense amplifier circuit. After the first pre-charge circuit 102 has been enabled for a period of time and the memory cell is enabled for an operation, i.e. read operation, the second pre-charge circuit 104 is enabled to pull the cell current $I_{CELL}$ from the memory cell to the sense amplifier circuit. The bias circuit 106 generates a bias voltage for the second pre-charge circuit 104 to enable the second pre-charge circuit 104 to operate.

The enable circuit 108 is then turned on by the enable signal EN. The cell current $I_{CELL}$ of the memory cell is then delivered to the current mirror 110. The current mirror 110 amplifies the cell current $I_{CELL}$ according to the erase count of the memory cell to generate an amplified cell current. The charge voltage $V_{OUT}$ will gradually change over a period of time according to the amplified cell current.

The value of the cell current $I_{CELL}$ of the memory cell is determine by the command being executed by the memory cell, i.e. read on/off. If the memory cell is executing a "read off", the cell current $I_{CELL}$ of the memory cell is low enough such that the charge voltage $V_{OUT}$ is still greater than the reference voltage $V_{REF}$ after the value of the charge voltage $V_{OUT}$ has been pulled down according to the amplified cell current. If the memory cell is executing a "read on", the cell current $I_{CELL}$ of the memory cell is high enough such that the charge voltage $V_{OUT}$ generated is lower than the reference voltage $V_{REF}$ after the value of the charge voltage $V_{OUT}$ has been pulled down according to the amplified cell current. The period of time to pull down the value of the charge voltage $V_{OUT}$ according to the amplified cell current is an access time of the memory cell.

The first comparator 202 continuously compares the charge voltage $V_{OUT}$ to the reference voltage $V_{REF}$. The comparison result is an indication of the command being executed by the memory cell, i.e. logic zero for "read off" and logic one for "read on". The comparison result is then inputted through the buffer 204. The buffer 204 is a signal conditioning circuit. The buffer 204 is used to transfer a voltage from a first circuit that may have a high output impedance level, to a second circuit that may have a low input impedance level. The buffer 204 prevents the second circuit from loading the first circuit unacceptably and interfering with its desired operation. For the present invention, since the sense amplifier circuit is an analogue circuit, the comparison result generated by the sense amplifier circuit may be conditioned to be a compatible digital input of a digital circuit.

Figure 4:
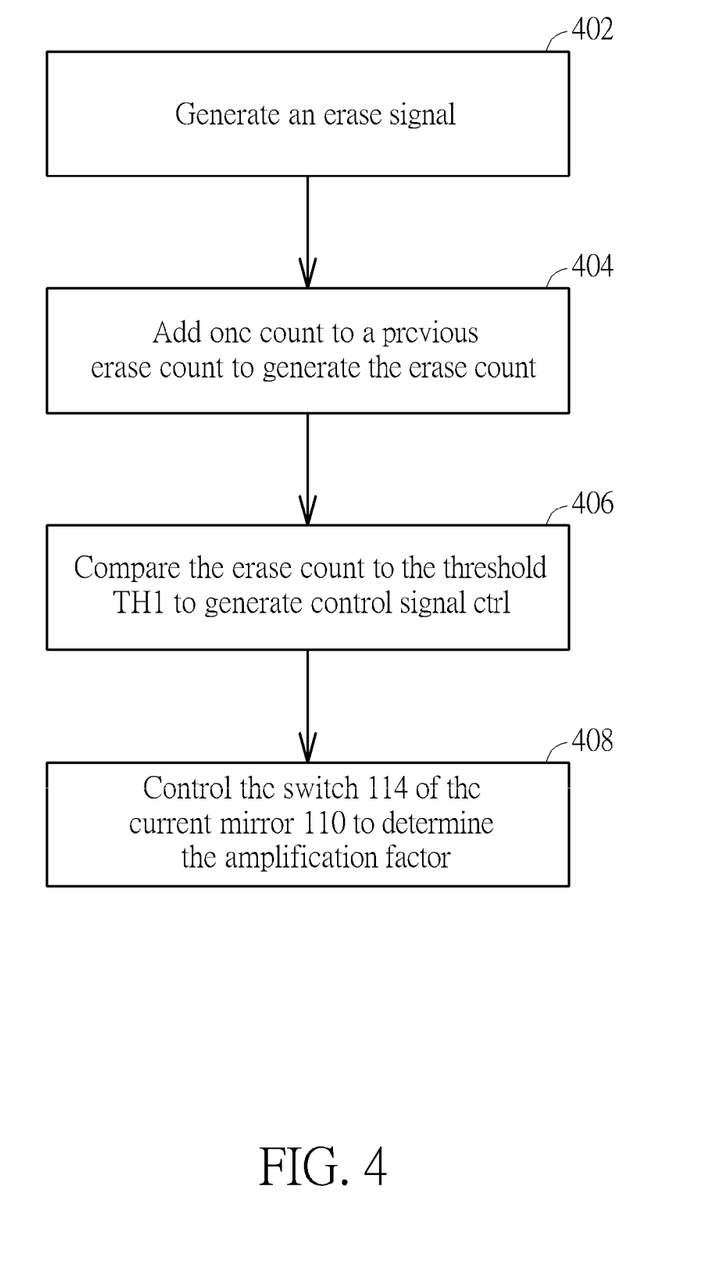
FIG. 4 illustrates a flowchart of a method of operation of the control circuit in FIG. 3.

Please refer to FIG. 4. FIG. 4 illustrates a flowchart of a method of operation of the control circuit 300 in FIG. 3. The method of operation may include and is not limited to the following steps:

Step 402: An erase signal is generated from the memory cell;

Step 404: The counter 302 add one count to a previous erase count of a previous erase signal to generate the erase count;

Step 406: The second comparator 304 compares the erase count to the threshold TH1 to generate control signal ctrl for the current mirror; and Step 408: The control signal ctrl controls the switch 114 of the current mirror 110 to determine the amplification factor of the cell current $I_{CELL}$.

For the control circuit 300, the second comparator 304 is not limited to comparing the erase count to one threshold. The control circuit 300 compares the erase count to at least one threshold to generate a control signal ctrl. The control signal ctrl is not limited to a single bit. The control signal ctrl may comprise of a plurality of bits corresponding to the number of switches 114 used in the current mirror 110.

Figure 5:
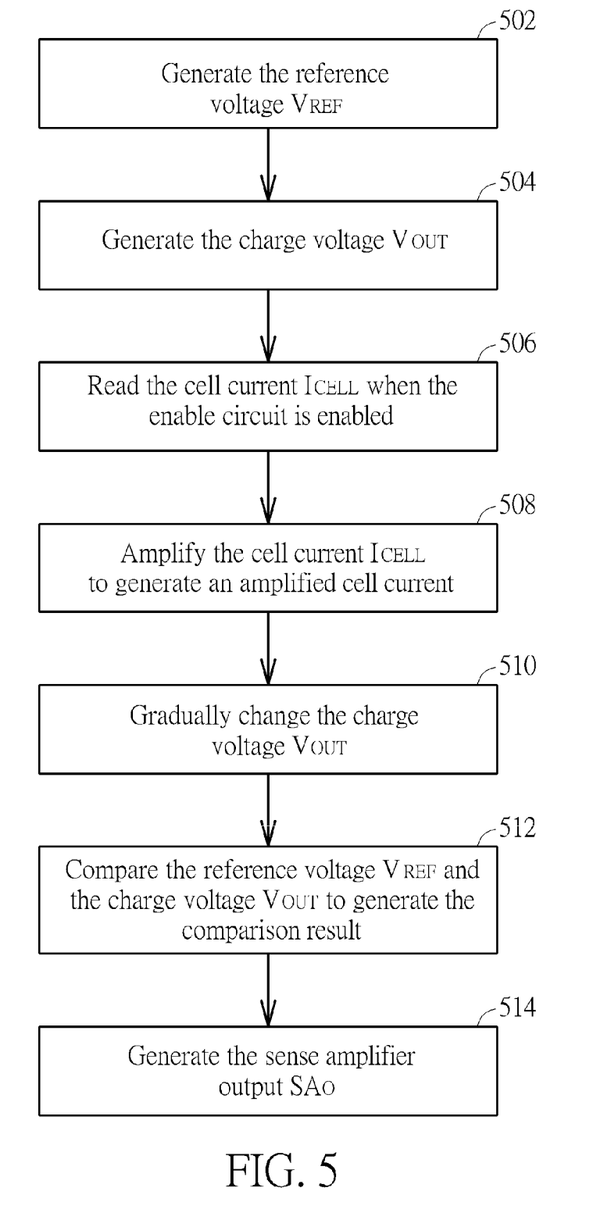
FIG. 5 illustrates a flowchart of a method of operation of the sense amplifier circuit according to the present invention.

Please refer to FIG. 5. FIG. 5 illustrates a flowchart of a method of operation of the sense amplifier circuit according to the present invention. The method of operation may include and is not limited to the following steps:

Step 502: The front end 100 of the sense amplifier circuit generates the reference voltage $V_{REF}$ according to the reference current $I_{REF}$ generated from the reference circuit 112;

Step 504: The first pre-charge circuit 102 generates the charge voltage $V_{OUT}$ having value greater than the reference voltage $V_{REF}$;

Step 506: The front end 100 of the sense amplifier circuit reads the cell current $I_{CELL}$ of the memory cell when the enable circuit is enabled by an enable signal EN;

Step 508: The current mirror 110 amplifies the cell current $I_{CELL}$ to generate an amplified cell current;

Step 510: The front end 100 of the sense amplifier circuit gradually changes the charge voltage $V_{OUT}$ according the amplified cell current;

Step 512: The first comparator 202 compares the reference voltage $V_{REF}$ and the charge voltage $V_{OUT}$ to generate the comparison result; and Step 514: The buffer 204 generates the sense amplifier output $SA_O$ according to the comparison result.

Figure 6:
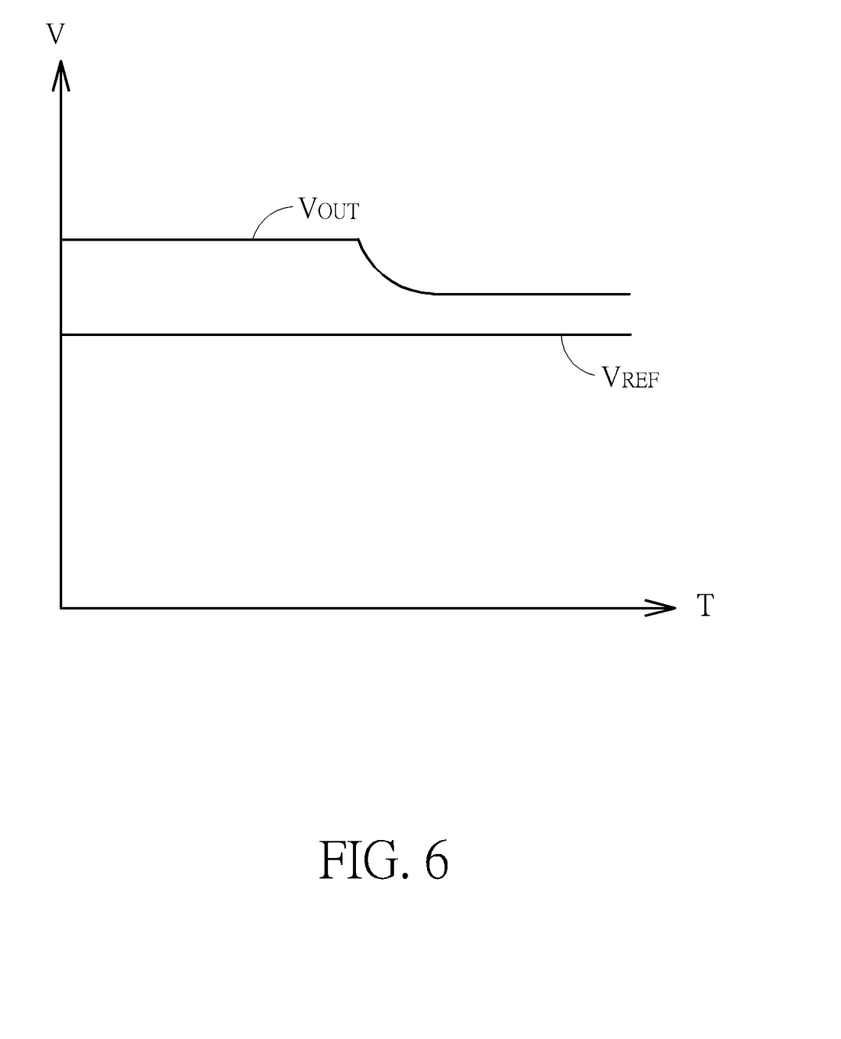
FIG. 6 illustrates an output waveform of the sense amplifier circuit with the memory cell at off cycle.

Please refer to FIG. 6. FIG. 6 illustrates an output waveform of the sense amplifier circuit with the memory cell at off cycle. The cell current $I_{CELL}$ of the memory cell during off cycle is less than the reference current $I_{REF}$. For the sense amplifier circuit, the reference voltage $V_{REF}$ generated according to the reference current $I_{REF}$ is less than the charge voltage $V_{OUT}$ generated according to the first pre-charge circuit 102. After the cell current $I_{CELL}$ is read from the memory cell during off cycle, the charge voltage will change according to the cell current $I_{CELL}$. Since the cell current $I_{CELL}$ for off cycle is low enough, the charge voltage $V_{OUT}$ is not pulled down to have a voltage value less than the reference voltage $V_{REF}$. The sense amplifier circuit successfully reads that the memory cell is at off cycle.

Figure 7:
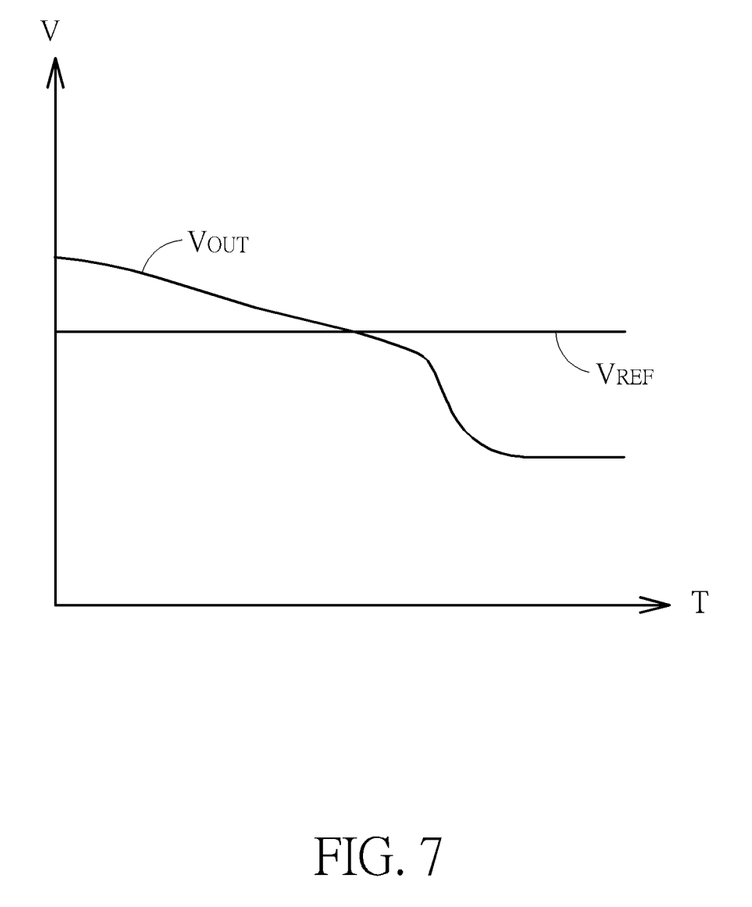
FIG. 7 illustrates an output waveform of the sense amplifier circuit with the memory cell at on cycle.

Please refer to FIG. 7. FIG. 7 illustrates an output waveform of the sense amplifier circuit with the memory cell at on cycle. The cell current $I_{CELL}$ of the memory cell during on cycle is greater than the reference current $I_{REF}$. For the sense amplifier circuit, the reference voltage $V_{REF}$ generated according to the reference current $I_{REF}$ is less than the charge voltage $V_{OUT}$ generated according to the first pre-charge circuit 102. After the cell current $I_{CELL}$ is read from the memory cell during on cycle, the charge voltage will change according to the cell current $I_{CELL}$. Since the cell current $I_{CELL}$ for on cycle is higher than the reference current $I_{REF}$, the charge voltage $V_{OUT}$ is pulled down to a value less than the reference voltage $V_{REF}$. The sense amplifier circuit successfully reads that the memory cell is at on cycle.

The sense amplifier circuit has the current mirror 110 that is able to amplify the cell current $I_{CELL}$ of the memory cell according to the erase count. The difference between the cell current $I_{CELL}$ and the reference current $I_{REF}$ becomes smaller as the number of erase cycles increases. The change in the difference between the cell current $I_{CELL}$ and the reference current $I_{REF}$ will make probability of error on the memory cell to get higher. To avoid error from happening, the cell current $I_{CELL}$ is amplified, causing the difference between the cell current $I_{CELL}$ and the reference current $I_{REF}$ to get larger. Thereby, errors from having a small difference between the cell current $I_{CELL}$ and the reference current $I_{REF}$ are avoided.

Since the use of the current mirror 110 will increase power consumption of the memory device, the current mirror 110 disclosed is designed to have several stages of amplification. The current mirror 110 has two stage of amplification. And the number of stages used is selected by controlling the switch 114. The current mirror 110 is only an example to illustrate aspects of the present invention for clarity and not intended to limit the scope of the invention. In place of the current mirror 110 may be a current mirror having a plurality of stages of amplification and a plurality of switches 114 for selection of number of stages used.

The number of stages of amplification used in the current mirror 110 is controlled using the control circuit 300. The control circuit 300 generates the control signal ctrl according to the erase count of the memory for controlling the switch 114. The control signal ctrl may have at least one bit for controlling the switch 114. The number of bits for the control signal ctrl may be designed according to the number of switches used in the current mirror 110.

A period of time it takes to pull the charge voltage $V_{OUT}$ from the charge voltage $V_{OUT}$ generated according to the first pre-charge circuit 102 to the charge voltage $V_{OUT}$ according to the cell current $I_{CELL}$ that is less than the reference voltage $V_{REF}$ during on cycle of the memory cell is the access time of the memory cell. Although the difference between the cell current $I_{CELL}$ and the reference current $I_{REF}$ may get smaller as the erase count increases, smaller difference though may not cause an error every time but may cause the access time to increase. By amplifying the cell current $I_{CELL}$, the access time of the memory cell may be maintained or shortened. The cell current $I_{CELL}$ is amplified and allows the charge voltage $V_{OUT}$ to be pulled down according to the cell current $I_{CELL}$ for shorter access time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sense amplifier circuit, comprising:
   a reference circuit configured to generate a reference voltage according to a reference current;
   a first pre-charge circuit configured to generate a charge voltage greater than the reference voltage;
   a second pre-charge circuit configured to generate a cell current;
   a current mirror coupled to the first pre-charge circuit having a switch used to control amplification of the cell current according to a control signal to generate an amplified cell current;
   an enable circuit coupled to the second pre-charge circuit and configured to enable the current mirror;
   a first comparator coupled to the current mirror and configured to compare the reference voltage and a new charge voltage generated according to the amplified cell current and the charge voltage to generate a comparison result; and
   a buffer configured to generate a sense amplifier output according to the comparison result.

2. The sense amplifier circuit of claim 1 further comprising a bias circuit coupled to the second pre-charge circuit and configured to generate a bias voltage for the second pre-charge circuit.

3. The sense amplifier circuit of claim 1 further comprising a control circuit coupled to the switch of the current mirror and configured to generate the control signal.

4. The sense amplifier circuit of claim 3 wherein the control circuit comprises:
   a counter configured to generate the erase count of the memory cell; and
   a second comparator coupled to the counter and the current mirror and configured to generate the control signal according to the erase count of the memory cell and at least one threshold.

5. The sense amplifier circuit of claim 1 wherein the first pre-charge circuit, the second pre-charge circuit, the bias circuit and the enable circuit are coupled to a power supply voltage.

6. The sense amplifier circuit of claim 1 wherein the enable circuit and the current mirror are coupled to a common mode voltage.

7. The sense amplifier circuit of claim 1 wherein the current mirror comprises:
   a first PMOS transistor having a first terminal, a second terminal and a gate terminal coupled to the second terminal of the first PMOS transistor, the first terminal, the second terminal and the gate terminal of the first PMOS transistor being coupled to the enable circuit;
   a second PMOS transistor having a first terminal coupled to the enable circuit, a second terminal and a gate terminal coupled to the gate terminal of the first PMOS transistor;
   a first NMOS transistor having a first terminal coupled to the second terminal of the second PMOS transistor, a second terminal coupled to a common mode voltage, and a gate terminal coupled to the second terminal of the second PMOS transistor; and
   a second NMOS transistor having a first terminal coupled to the second terminal of the first PMOS transistor, a second terminal coupled to the common mode voltage, and a gate terminal coupled to the gate terminal of the first NMOS transistor.

8. The sense amplifier circuit of claim 7 wherein the current mirror further comprises:
   the switch having a first terminal the gate terminal of the second NMOS transistor, a second terminal and a control terminal configured to receive a control signal; and
   a third NMOS transistor having a first terminal coupled to the second terminal of the first PMOS transistor, a second terminal coupled to the common mode voltage, and a gate terminal coupled to the second terminal of the switch.

9. The sense amplifier circuit of claim 8 wherein the switch comprises:
   a third PMOS transistor having a first terminal coupled to the gate terminal of the second NMOS transistor, a second terminal coupled to the gate terminal of the third NMOS transistor, and a gate terminal configured to receive the control signal; and
   a fourth NMOS transistor having a first terminal coupled to the gate terminal of the third NMOS transistor, a second terminal coupled to the common mode voltage, and a gate terminal coupled to the gate terminal of the third PMOS transistor.

10. The sense amplifier circuit of claim 7 further comprises:
    a fourth PMOS transistor having a first terminal coupled to the enable circuit, a second terminal, and a gate terminal coupled to the first and second terminals of the fourth PMOS transistor; and
    a fifth PMOS transistor having a first terminal coupled to the second terminal of the fourth PMOS transistor, a second terminal coupled to the second terminal of the first PMOS transistor, and a gate terminal coupled to the reference circuit.

11. The sense amplifier circuit of claim 1 wherein the reference circuit is a bandgap reference circuit.

12. A method of operation of a sense amplifier circuit, comprising:
    generating a reference voltage according to a reference current;
    generating a charge voltage greater than the reference voltage;
    generating a cell current when an enable circuit is enabled;
    generating a control signal for controlling a switch used to selectively control generation of an amplified cell current;
    generating a new charge voltage according the amplified cell current and the charge voltage;
    comparing the reference voltage and the new charge voltage to generate a comparison result; and
    generating a sense amplifier output according to the comparison result.

13. The method of claim 12 wherein generating the control signal for controlling the switch used to selectively control generation of the amplified cell current is generating the control signal for controlling the switch used for selecting number of times the cell current is to be amplified to generate the amplified cell current.

14. The method of claim 13 wherein the control signal is generated according to an erase count of the memory cell and at least one threshold.

15. The method of claim 12 wherein the new charge voltage is the charge voltage discharged according to the amplified cell current.

* * * * *